(12) United States Patent
Bak

(10) Patent No.: US 10,580,965 B2
(45) Date of Patent: Mar. 3, 2020

(54) MAGNETIC MEMORY DEVICE

(71) Applicant: Junghoon Bak, Suwon-si (KR)

(72) Inventor: Junghoon Bak, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/862,089

(22) Filed: Jan. 4, 2018

(65) Prior Publication Data

US 2018/0205003 A1 Jul. 19, 2018

(30) Foreign Application Priority Data

Jan. 18, 2017 (KR) .................. 10-2017-0008776

(51) Int. Cl.
| | |
|---|---|
| *H01L 43/02* | (2006.01) |
| *H01L 43/08* | (2006.01) |
| *H01L 27/22* | (2006.01) |
| *H01L 43/10* | (2006.01) |
| *G11C 11/16* | (2006.01) |
| *H01L 43/12* | (2006.01) |

(52) U.S. Cl.
CPC ............ *H01L 43/02* (2013.01); *H01L 27/222* (2013.01); *H01L 27/228* (2013.01); *H01L 43/08* (2013.01); *G11C 11/161* (2013.01); *G11C 11/1655* (2013.01); *H01L 43/10* (2013.01); *H01L 43/12* (2013.01)

(58) Field of Classification Search
CPC ....... H01L 43/02; H01L 27/228; H01L 43/08; H01L 27/222; H01L 43/10; H01L 43/12; H01L 21/67709; H01L 27/22; H01L 21/8229; H01L 27/1052; H01L 27/108; H01L 27/10894; H01L 27/112; H01L 27/11206; H01L 27/11293; H01L 27/11521; H01L 27/11529; H01L 27/24; H01L 45/04; H01L 2924/1435; G11C 11/1655; G11C 11/161
See application file for complete search history.

(56) References Cited

U.S. PATENT DOCUMENTS

| | | |
|---|---|---|
| 7,088,610 B2 | 8/2006 | Tai |
| 7,264,985 B2 | 9/2007 | Chung et al. |
| 8,492,808 B2 | 7/2013 | Omori et al. |
| 8,574,926 B2 | 11/2013 | Noma et al. |
| 8,629,494 B2 | 1/2014 | Kim et al. |
| 8,772,051 B1 | 7/2014 | Zhong et al. |

(Continued)

FOREIGN PATENT DOCUMENTS

| | | |
|---|---|---|
| JP | 4329414 B2 | 9/2009 |
| KR | 20130019294 A | 2/2013 |

*Primary Examiner* — Moin M Rahman
(74) *Attorney, Agent, or Firm* — Renaissance IP Law Group LLP

(57) ABSTRACT

A plurality of magnetic tunnel junction structures is arranged in rows and columns on a substrate. A plurality of top electrodes is disposed on the plurality of magnetic tunnel junction structures, respectively. A plurality of bit lines is disposed on the substrate. One of the plurality of bit lines is disposed between two magnetic tunnel junction structures, adjacent to each other, of the plurality of magnetic tunnel junction structures. A top surface of each of the plurality of bit lines is disposed at substantially the same level as a top surface of each of the plurality of top electrodes.

18 Claims, 8 Drawing Sheets

(56) References Cited

U.S. PATENT DOCUMENTS

| | | |
|---|---|---|
| 9,620,411 B2 | 4/2017 | Mani |
| 2005/0030821 A1 | 2/2005 | Tai |
| 2007/0045759 A1 | 3/2007 | Chung et al. |
| 2008/0197496 A1 | 8/2008 | Mori et al. |
| 2012/0043630 A1 | 2/2012 | Omori et al. |
| 2012/0241880 A1* | 9/2012 | Noma .................. H01L 27/105 |
| | | 257/421 |
| 2013/0043530 A1 | 2/2013 | Kim et al. |
| 2015/0311253 A1* | 10/2015 | Choi .................... H01L 27/228 |
| | | 257/252 |
| 2016/0225818 A1 | 8/2016 | Toh et al. |
| 2016/0240431 A1 | 8/2016 | Mani |

* cited by examiner

MAGNETIC MEMORY DEVICE

CROSS-REFERENCE TO RELATED APPLICATION

This application claims priority under 35 U.S.C. § 119 to Korean Patent Application No. 10-2017-0008776, filed on Jan. 18, 2017, in the Korean Intellectual Property Office, the disclosure of which is hereby incorporated by reference in its entirety.

TECHNICAL FIELD

The present inventive concept relates to a magnetic memory device.

DISCUSSION OF RELATED ART

Semiconductor memory devices are used in an electronic product to store information. As the semiconductor memory devices become highly integrated, process margins of manufacturing thereof reduce, and resistances of memory cells of the semiconductor memory devices increase.

SUMMARY

According to an exemplary embodiment of the present inventive concept, a magnetic memory device is provided as follows. A plurality of magnetic tunnel junction structures is arranged in rows and columns on a substrate. A plurality of top electrodes is disposed on the plurality of magnetic tunnel junction structures, respectively. A plurality of bit lines is disposed on the substrate. One of the plurality of bit lines is disposed between two magnetic tunnel junction structures, adjacent to each other, of the plurality of magnetic tunnel junction structures. A top surface of each of the plurality of bit lines is disposed at substantially the same level as a top surface of each of the plurality of top electrodes.

According to an exemplary embodiment of the present inventive concept, a magnetic memory device is provided as follows. A plurality of magnetic tunnel junction structures is arranged in a first direction and a second direction intersecting the first direction. Each of the plurality of magnetic tunnel junction structures includes a first magnetic conductive pattern, a tunnel barrier pattern, and a second magnetic conductive pattern that are stacked as listed on a substrate. A plurality of bit lines is disposed on the substrate. One of the plurality of bit lines is disposed between two magnetic tunnel junction structures, adjacent to each other in the second direction, of the plurality of magnetic tunnel junction structures. The plurality of bit lines each extends in the first direction. The plurality of bit lines each includes the same material as the second magnetic conductive pattern.

According to an exemplary embodiment of the present inventive concept, a magnetic memory device is provided as follows. A bit line is disposed on a substrate, extending in a first direction. A dummy bit line is disposed between the bit line and the substrate. A first magnetic tunnel junction structure is disposed on a substrate and adjacent to a first side of the bit line. A second magnetic tunnel junction structure is disposed on the substrate and adjacent to a second side of the bit line. The first magnetic tunnel junction structure and the second magnetic tunnel junction structure are arranged in a second direction intersecting the first direction. A top electrode is disposed on the first magnetic tunnel junction structure. A thickness of a combined structure of the bit line and the dummy bit line is substantially the same as a thickness of a combined structure of the top electrode of the first magnetic tunnel junction structure.

BRIEF DESCRIPTION OF DRAWINGS

These and other features of the present inventive concept will become more apparent by describing in detail exemplary embodiments thereof with reference to the accompanying drawings of which:

FIGS. 3A to 5A are cross-sectional views taken along line I-I' of FIG. 1 to illustrate a method of manufacturing a magnetic memory device according to an exemplary embodiment of the present inventive concept; and FIGS. 3B to 5B are cross-sectional views taken along line II-II' of FIG. 1 to illustrate a method of manufacturing a magnetic memory device according to an exemplary embodiment of the present inventive concept.

DETAILED DESCRIPTION OF EXEMPLARY EMBODIMENTS

Figure 1:
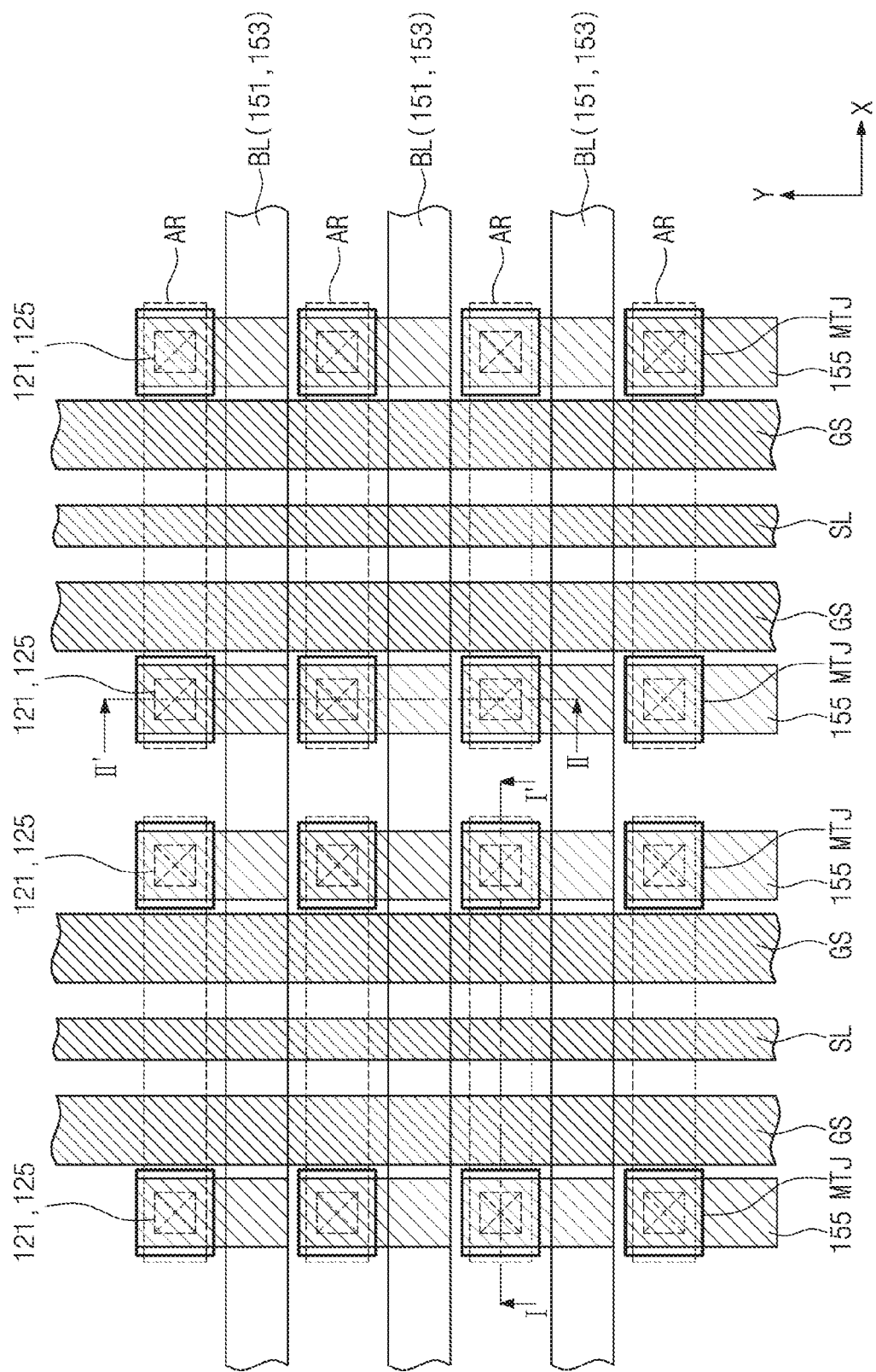
FIG. 1 is a plan view illustrating a magnetic memory device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

The values such as thickness and width or the material of a constituent element may be expressed using "substantially the same" or "about", because the values or material in a semiconductor device fabricated according to the present inventive concept may be different from the exact value or material claimed below due to a process variation for forming the semiconductor device or due to a measurement error.

Figure 2A:
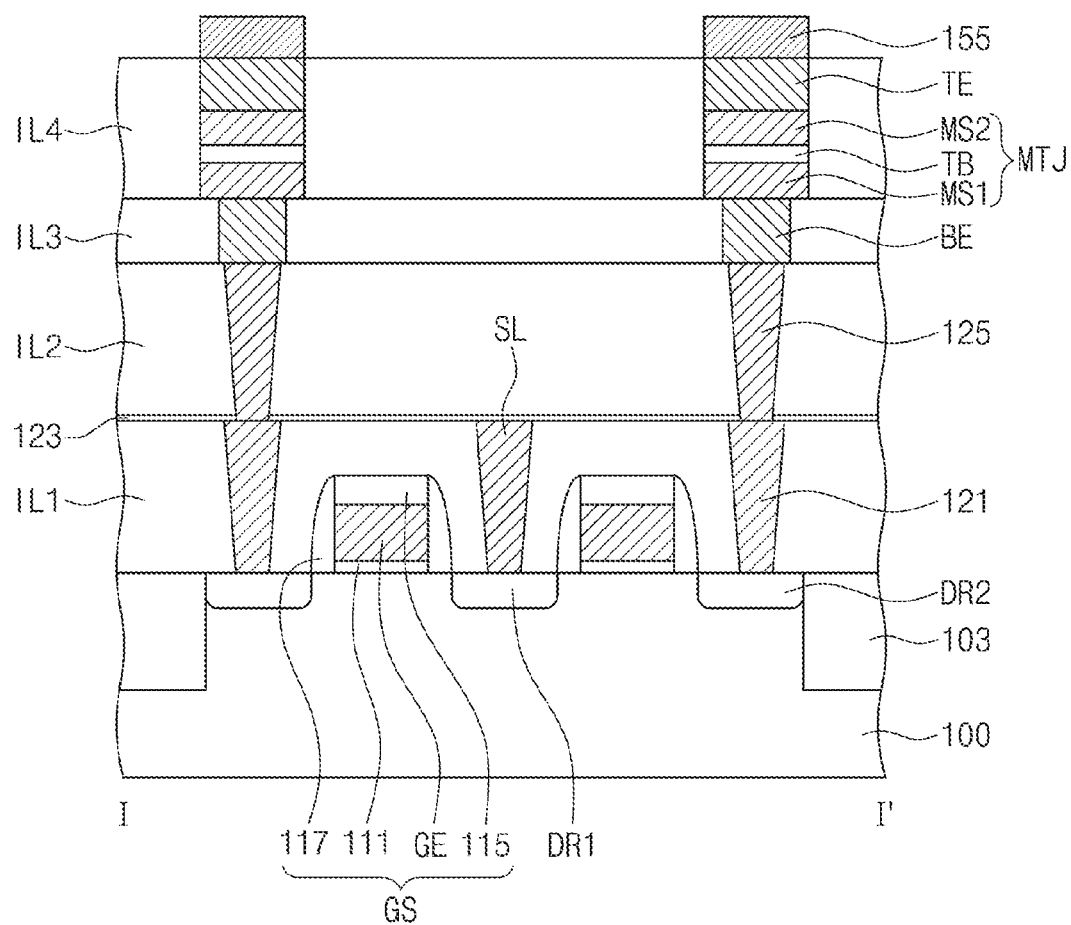
FIG. 2A is a cross-sectional view taken along line I-I' of FIG. 1 according to an exemplary embodiment of the present inventive concept.
Figure 2B:
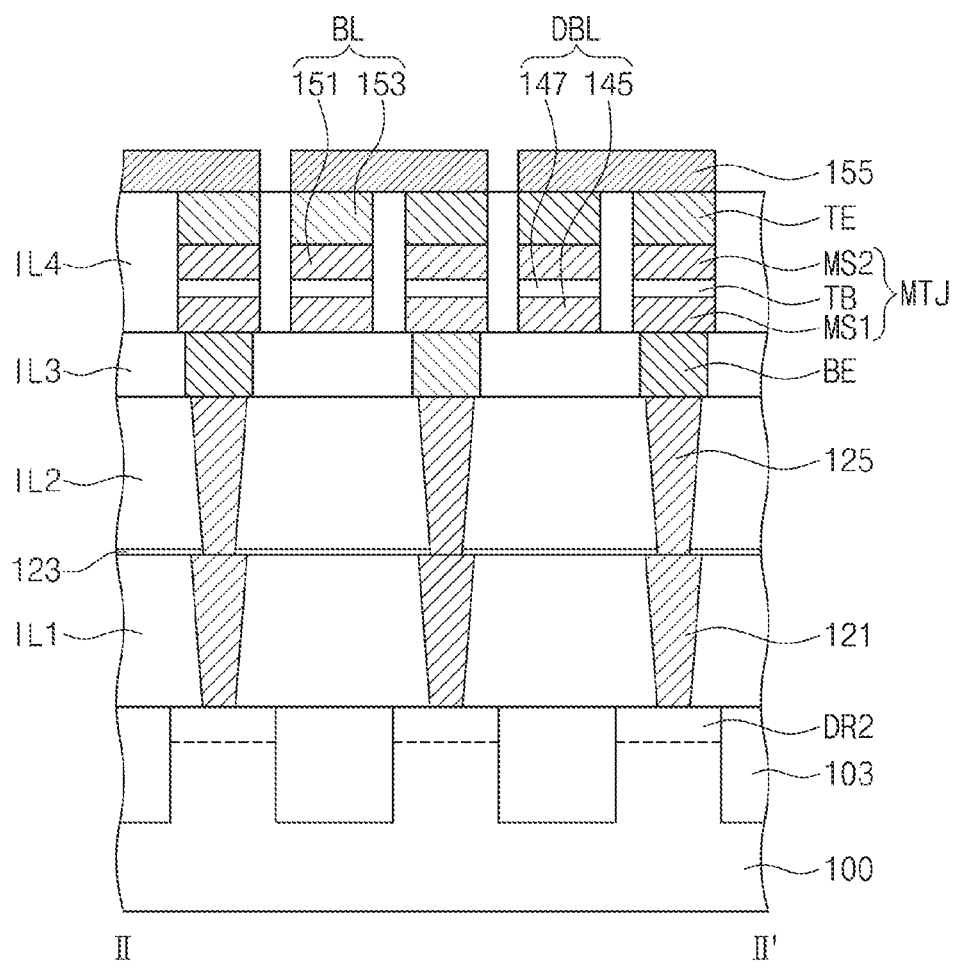
FIG. 2B is a cross-sectional view taken along line II-II' of FIG. 1 according to an exemplary embodiment of the present inventive concept.

FIG. 1 is a plan view illustrating a magnetic memory device according to an exemplary embodiment of the present inventive concept. FIG. 2A is a cross-sectional view taken along line I-I' of FIG. 1 according to an exemplary embodiment of the present inventive concept. FIG. 2B is a cross-sectional view taken along line II-II' of FIG. 1 according to an exemplary embodiment of the inventive concept.

Referring to FIGS. 1, 2A, and 2B, a device isolation layer 103 may be disposed in a substrate 100. The device isolation layer 103 may define active regions AR of the substrate 100. Each of the active regions AR may have a bar-type island shape extending in a first direction X when viewed in plan. In an exemplary embodiment, the substrate 100 may be a silicon substrate, a germanium substrate, or a silicon-germanium substrate. The substrate 100 may have a first conductivity type.

Gate structures GS may be disposed on the active regions AR. For example, a pair of the gate structures GS may be disposed on one active region AR. The gate structures GS may extend in a second direction Y intersecting the first direction X. The gate structures GS may intersect the active regions AR. Each of the gate structures GS may include a gate insulating layer 111, a gate electrode GE, a gate capping layer 115, and spacers 117. The gate insulating layer 111 may be disposed on a top surface of the substrate 100 (i.e., on a top surface of the active region AR). For example, the gate insulating layer 111 may include a silicon oxide layer, a thermal oxide layer, or a high-k dielectric layer (e.g., a hafnium oxide layer or an aluminum oxide layer). The gate electrode GE may be disposed on the gate insulating layer 111. For example, the gate electrode GE may include a conductive material such as poly-silicon doped with dopants, a metal, a metal alloy, and a metal silicide. The gate capping layer 115 may be disposed on the gate electrode GE. The gate capping layer 115 may include an insulating material (e.g., a silicon oxide layer or a silicon nitride layer). The spacers 117 may be disposed on sidewalls of the gate insulating layer 111, sidewalls of the gate electrode GE, and sidewalls of the gate capping layer 115. The spacers 117 may include an insulating material (e.g., a silicon oxide layer or a silicon nitride layer).

A first dopant region DR1 may be disposed in each of the active regions AR between the pair of gate structures GS disposed on each of the active regions AR. For example, the first dopant region DR1 may be disposed in a central portion of the active region AR. A pair of cell transistors disposed on each of the active regions AR may share the first dopant region DR1. Second dopant regions DR2 may be disposed in the active regions AR between the device isolation layer 103 and the gate structures GS. In an exemplary embodiment, the second dopant regions DR2 may be disposed in end portions of the active regions AR. The pair of the second dopant regions DR2 may be disposed in each of the active regions AR. The pair of gate structures GS and the first dopant region DR1 may be disposed between the pair of second dopant regions DR2 when viewed in plan. The first dopant region DR1 and the second dopant regions DR2 may correspond to source/drain regions of the cell transistors. The first and second dopant regions DR1 and DR2 may be doped with dopants of a second conductivity type different from the first conductivity type. One of the first and second conductivity types may be an N-type, and the other of the first and second conductivity types may be a P-type.

A first interlayer insulating layer IL1 may be disposed on the substrate 100. The first interlayer insulating layer IL1 may cover the gate structures GS. For example, the first interlayer insulating layer IL1 may include a silicon oxide layer.

Source lines SL may be disposed in the first interlayer insulating layer IL1. The source lines SL may be electrically connected to the first dopant regions DR1. Each of the source lines SL may extend in the second direction Y to intersect the active regions AR arranged in the second direction Y. Each of the source lines SL may be electrically connected in common to the first dopant regions DR1 respectively formed in the active regions AR arranged in the second direction Y. For example, the source lines SL may include a doped semiconductor material (e.g., doped silicon), a metal (e.g., tungsten, aluminum, titanium, or tantalum), a conductive metal nitride (e.g., titanium nitride, tantalum nitride, or tungsten nitride), or a metal-semiconductor compound (e.g., a metal silicide).

First contact plugs 121 may be disposed in the first interlayer insulating layer IL1. The first contact plugs 121 may be electrically connected to the second dopant regions DR2, respectively. The first contact plugs 121 may be disposed on the end portions of the active regions AR, respectively. Top surfaces of the first contact plugs 121 may be coplanar with top surfaces of the source lines SL and a top surface of the first interlayer insulating layer IL1 at substantially the same height from the substrate 100. For example, the first contact plugs 121 may include a doped semiconductor material (e.g., doped silicon), a metal (e.g., tungsten, aluminum, titanium, and/or tantalum), a conductive metal nitride (e.g., titanium nitride, tantalum nitride, or tungsten nitride), or a metal-semiconductor compound (e.g., a metal silicide).

A capping insulating layer 123 may be disposed on the first interlayer insulating layer IL1. The capping insulating layer 123 may cover the top surfaces of the source lines SL. The capping insulating layer 123 may include an insulating material having etch selectivity with respect to the first interlayer insulating layer IL1. For example, the capping insulating layer 123 may include a silicon nitride layer or a silicon oxynitride layer.

A second interlayer insulating layer IL2 may be disposed on the capping insulating layer 123. For example, the second interlayer insulating layer IL2 may include a silicon oxide layer. Second contact plugs 125 may be disposed in the second interlayer insulating layer IL2 and the capping insulating layer 123. The second contact plugs 125 may be electrically connected to the first contact plugs 121, respectively. The second contact plugs 125 may be electrically connected to the second dopant regions DR2 through the first contact plugs 121, respectively. Top surfaces of the second contact plugs 125 may be coplanar with a top surface of the second interlayer insulating layer IL2 at substantially the same height from the substrate 100.

A third interlayer insulating layer IL3 may be disposed on the second interlayer insulating layer IL2. For example, the third interlayer insulating layer IL3 may include a silicon oxide layer. Bottom electrodes BE may be disposed in the third interlayer insulating layer IL3. The bottom electrodes BE may be electrically connected to the second contact plugs 125, respectively. For example, the bottom electrodes BE may include a conductive metal nitride (e.g., titanium nitride or tantalum nitride), a metal (e.g., tungsten, titanium, or tantalum), or a rare-earth metal (e.g., ruthenium or platinum).

Magnetic tunnel junction structures MTJ may be disposed on the bottom electrodes BE, respectively. The magnetic tunnel junction structures MTJ may vertically overlap the bottom electrodes BE, respectively. The magnetic tunnel junction structures MTJ may vertically overlap the end portions of the active regions AR, respectively. The magnetic tunnel junction structures MTJ may vertically overlap the second dopant regions DR2, respectively. The magnetic tunnel junction structures MTJ may be spaced apart from each other in the first direction X and the second direction Y. The magnetic tunnel junction structures MTJ may be arranged in rows and columns. The rows of the magnetic tunnel junction structures MTJ may be arranged in the first direction X. The columns of the magnetic tunnel junction structures MTJ may be arranged in the second direction Y. Each of the rows of the magnetic tunnel junction structure MTJ and each of the bit lines BL may be arranged alternately in the second direction. Each of the magnetic tunnel junction structures MTJ may include a first magnetic conductive pattern MS1, a second magnetic conductive pattern MS2, and a tunnel barrier pattern TB.

The first magnetic conductive pattern MS1 may be disposed on a top surface of one of the bottom electrodes BE. The first magnetic conductive pattern MS1 may be in contact with the one of the bottom electrodes BE. The second magnetic conductive pattern MS2 may be disposed on the first magnetic conductive pattern MS1. One of the first and second magnetic conductive patterns MS1 and MS2 may be a pinned pattern, and the other of the first and second magnetic conductive patterns MS1 and MS2 may be a free pattern.

In an exemplary embodiment, the first magnetic conductive pattern MS1 may be the pinned pattern having a magnetization direction fixed in one direction, and the second magnetic conductive pattern MS2 may be the free pattern having a changeable magnetization direction. The magnetization directions of the first and second magnetic conductive patterns MS1 and MS2 may be substantially parallel to the top surface of the substrate 100. In this case, the first magnetic conductive pattern MS1 may include a layer including an anti-ferromagnetic material and a layer including a ferromagnetic material. The layer including the anti-ferromagnetic material may include PtMn, IrMn, MnO, MnS, MnTe, $MnF_2$, $FeCl_2$, FeO, $CoCl_2$, CoO, $NiCl_2$, NiO, or Cr. The layer including the anti-ferromagnetic material may include at least one precious metals such as ruthenium (Ru), rhodium (Rh), palladium (Pd), osmium (Os), iridium (Ir), platinum (Pt), gold (Au), and silver (Ag). The layer including the ferromagnetic material may include CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic conductive pattern MS2 may include a ferromagnetic material. For example, the second magnetic conductive pattern MS2 may include FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

In an exemplary embodiment, the second magnetic conductive pattern MS2 may include a plurality of layers. For example, the second magnetic conductive pattern MS2 may include a plurality of ferromagnetic material layers and a non-magnetic material layer disposed between the ferromagnetic material layers. In this case, the ferromagnetic material layers and the non-magnetic material layer may constitute a synthetic anti-ferromagnetic layer.

In an exemplary embodiment, the magnetization directions of the first and second magnetic conductive patterns MS1 and MS2 may be substantially perpendicular to the top surface of the substrate 100. In this case, each of the first and second magnetic conductive patterns MS1 and MS2 may include a material having a $L1_0$ crystal structure, a material having a hexagonal close packed (HCP) lattice structure, or an amorphous rare-earth transition metal (amorphous RE-TM) alloy. In an exemplary embodiment, each of the first and second magnetic conductive patterns MS1 and MS2 may include the material having the $L1_0$ crystal structure, which includes $Fe_{50}Pt_{50}$, $Fe_{50}Pd_{50}$, $Co_{50}Pt_{50}$, $Co_{50}Pd_{50}$, or $Fe_{50}Ni_{50}$. In an exemplary embodiment, each of the first and second magnetic conductive patterns MS1 and MS2 may include a cobalt-platinum (CoPt) disordered alloy having an HCP lattice structure and a platinum (Pt) content of 10 at % to 45 at %, or a $Co_3Pt$ ordered alloy having an HCP lattice structure. In an exemplary embodiment, each of the first and second magnetic conductive patterns MS1 and MS2 may include an amorphous RE-TM alloy which includes iron (Fe), cobalt (Co), and nickel (Ni) and at least one of terbium (Tb), dysprosium (Dy), or gadolinium (Gd). Tb, Dy, and Gd may correspond to the rare earth metals.

In an exemplary embodiment, each of the first and second magnetic conductive patterns MS1 and MS2 may include a material having an interface perpendicular magnetic anisotropy. The interface perpendicular magnetic anisotropy means a phenomenon that a magnetic layer having an intrinsic horizontal magnetization property has a perpendicular magnetization direction by an influence of an interface between the magnetic layer and another layer adjacent to the magnetic layer. Here, the intrinsic horizontal magnetization property may mean a property that a magnetic layer has a magnetization direction parallel to the widest surface of the magnetic layer when an external factor does not exist. For example, if the magnetic layer having the intrinsic horizontal magnetization property is formed on a substrate and an external factor does not exist, the magnetization direction of the magnetic layer may be substantially parallel to a top surface of the substrate.

In this case, each of the first and second magnetic conductive patterns MS1 and MS2 may include, for example, cobalt (Co), iron (Fe), or nickel (Ni). In an exemplary embodiment, each of the first and second magnetic conductive patterns MS1 and MS2 may further include at least one of non-magnetic material including boron (B), zinc (Zn), aluminum (Al), titanium (Ti), ruthenium (Ru), tantalum (Ta), silicon (Si), silver (Ag), gold (Au), copper (Cu), carbon (C), or nitrogen (N). For example, each of the first and second magnetic conductive patterns MS1 and MS2 may include CoFe or NiFe and may further include boron (B). In addition, to reduce saturation magnetizations of the first and second magnetic conductive patterns MS1 and MS2, the first and second magnetic conductive patterns MS1 and MS2 may further include titanium (Ti), aluminum (Al), silicon (Si), magnesium (Mg), or tantalum (Ta).

The tunnel barrier pattern TB may be disposed between the first and second magnetic conductive patterns MS1 and MS2. For example, the tunnel barrier pattern TB may include magnesium oxide, titanium oxide, aluminum oxide, magnesium-zinc oxide, or magnesium-boron oxide.

Top electrodes TE may be disposed on the magnetic tunnel junction structures MTJ, respectively. For example, each of the top electrodes TE may be disposed on a top surface of the second magnetic conductive pattern MS2. For example, the top electrodes TE may include a conductive metal nitride (e.g., titanium nitride or tantalum nitride), a metal (e.g., tungsten, titanium, or tantalum), or a rare-earth metal (e.g., ruthenium or platinum).

Bit lines BL may be disposed on the third interlayer insulating layer IL3. Each of the bit lines BL may be disposed between two magnetic tunnel junction structures MTJ adjacent to each other in the second direction Y and may extend in the first direction X. The bit lines BL may vertically overlap the device isolation layer 103. In other words, the bit lines BL may be vertically non-overlapped with the magnetic tunnel junction structures MTJ and the top electrodes TE. The bit lines BL may be physically and horizontally spaced apart from the top electrodes TE. For example, each of the bit lines BL and each of the magnetic tunnel junction structures MTJ may be arranged alternately in the second direction Y. Top surfaces of the bit lines BL may be disposed at substantially the same level as top surfaces of the top electrodes TE.

Each of the bit lines BL may include a magnetic pattern 151 and a conductive pattern 153, which are sequentially stacked on the third interlayer insulating layer IL3. A top surface of the magnetic pattern 151 may be disposed at substantially the same level as the top surface of the second magnetic conductive pattern MS2, and a thickness of the magnetic pattern 151 may be substantially equal to a thickness of the second magnetic conductive pattern MS2. A material of the magnetic pattern 151 may be substantially the same as the material of the second magnetic conductive pattern MS2. In an exemplary embodiment, if the second magnetic conductive pattern MS2 includes a plurality of layers, the magnetic pattern 151 may also include the plurality of layers that second magnetic conductive pattern MS2 includes. In this case, the number and a structure of the layers of the magnetic pattern 151 may be substantially the same as the number and a structure of the layers of the second magnetic conductive pattern MS2.

In an exemplary embodiment, if the second magnetic conductive pattern MS2 includes a metal oxide layer as one of the plurality of layers, the magnetic pattern 151 may also include the metal oxide layer that the second magnetic conductive pattern MS2 includes. The metal oxide layer included in the magnetic pattern 151 may have a very thin thickness (e.g., several tor tens angstroms) and may be an oxide layer including a metal. Thus, a resistance of the metal oxide layer of the magnetic pattern 151 may be close to zero (0). The metal oxide layer included in the magnetic pattern 151 need not affect a resistance of the magnetic pattern 151, and thus a conductive property of the magnetic pattern 151 may be maintained.

A top surface of the conductive pattern 153 may be disposed at substantially the same level as the top surfaces of the top electrodes TE, and a thickness of the conductive pattern 153 may be substantially equal to thicknesses of the top electrodes TE. A material of the conductive pattern 153 may be substantially the same as the material of the top electrodes TE. In an exemplary embodiment, if each of the top electrodes TE includes a plurality of layers, the conductive pattern 153 may also include the plurality of layers that the top electrodes TE include. In this case, the number and a structure of the layers of the conductive pattern 153 may be substantially the same as the number and a structure of the layers of the top electrode TE.

Dummy bit lines DBL may be disposed between the third interlayer insulating layer IL3 and the bit lines BL. The dummy bit lines DBL may extend in the first direction X along the bit lines BL. The dummy bit lines DBL may be in physical contact with the top surface of the third interlayer insulating layer IL3 and bottom surfaces of the bit lines BL. The dummy bit lines DBL may vertically overlap the device isolation layer 103. For example, the dummy bit line DBL may vertically overlap the device isolation layer 103 disposed between the active regions AR adjacent to each other in the second direction Y. In other words, the dummy bit lines DBL may be vertically non-overlapped with the active regions AR. Top surfaces of the dummy bit lines DBL may be disposed at substantially the same level as top surfaces of the tunnel barrier patterns TB of the magnetic tunnel junction structures MTJ.

Each of the dummy bit lines DBL may include a dummy magnetic pattern 145 and a dummy barrier pattern 147. The dummy magnetic pattern 145 may be disposed between the third interlayer insulating layer IL3 and the magnetic pattern 151. A top surface of the dummy magnetic pattern 145 may be disposed at substantially the same level as the top surface of the first magnetic conductive pattern MS1, and a thickness of the dummy magnetic pattern 145 may be substantially equal to a thickness of the first magnetic conductive pattern MS1. A material of the dummy magnetic pattern 145 may be substantially the same as the material of the first magnetic conductive pattern MS1. In an exemplary embodiment, if the first magnetic conductive pattern MS1 includes a plurality of layers, the dummy magnetic pattern 145 may also include the plurality of layers that the first magnetic conductive pattern MS1 includes. In this case, the number and a structure of the layers of the dummy magnetic pattern 145 may be substantially the same as the number and a structure of the layers of the first magnetic conductive pattern MS1.

The dummy barrier pattern 147 may be disposed between the dummy magnetic pattern 145 and the magnetic pattern 151. A top surface of the dummy barrier pattern 147 may be disposed at substantially the same level as the top surface of the tunnel barrier pattern TB, and a thickness of the dummy barrier pattern 147 may be substantially equal to a thickness of the tunnel barrier pattern TB. A material of the dummy barrier pattern 147 may be substantially the same as the material of the tunnel barrier pattern TB.

In an exemplary embodiment, the dummy bit line DBL and the bit line BL may vertically overlap each other. For example, the bit line BL may be stacked on the dummy bit line DBL. The dummy bit line DBL and the bit line BL may be in physical contact with each other, but may be electrically insulated from each other by the dummy barrier pattern 147. For example, the dummy bit line DBL may be disposed between one of the bit lines BL and the substrate 100, the dummy bit line DBL extending in the first direction. The one of the bit lines BL may be electrically insulated from the dummy bit line. In an exemplary embodiment, the dummy bit line DBL and the bit line BL, which vertically overlap each other, may be electrically connected to each other. In this case, the dummy barrier pattern 147 may be omitted from the dummy bit line DBL so that the dummy magnetic pattern 145 may be in contact with the magnetic pattern 151.

A fourth interlayer insulating layer IL4 may be disposed on the third interlayer insulating layer IL3. A top surface of the fourth interlayer insulating layer IL4 may be disposed at substantially the same level as the top surfaces of the top electrodes TE and the top surfaces of the bit lines BL. For example, the fourth interlayer insulating layer IL4 may include a silicon oxide layer.

Connection patterns 155 may be disposed on the fourth interlayer insulating layer IL4. The connection patterns 155 may electrically connect the top electrodes TE to the bit lines BL. The bit lines BL and the top electrodes TE, which are physically spaced apart from each other, may be electrically connected to each other through the connection patterns 155. For example, each of the connection patterns 155 may extend from the top surface of one of the top electrodes TE onto the top surface of one of the bit lines BL adjacent to the one of the top electrodes TE. In an exemplary embodiment, each of the connection patterns 155 may be in contact with the top surface of one of the bit lines BL and the top surface of the one of the top electrodes TE adjacent to the one of the bit lines BL. In an exemplary embodiment, the top electrodes TE arranged in the first direction X in a plan view may be electrically connected to the same bit line BL. The connection patterns 155 may include a metal material (e.g., tungsten or copper).

According to an exemplary embodiment, a thickness of a combined structure of the bit line BL and the dummy bit line DBL may be substantially the same as a thickness of a combined structure of the top electrode TE of the magnetic tunnel junction structure MTJ.

According to an exemplary embodiment, the combined structure of the bit line BL and the dummy bit line DBL and the combined structure of the top electrode TE of the magnetic tunnel junction structure MTJ may be arranged alternately in the second direction Y.

According to an exemplary embodiment, the combined structure of the bit line BL and the dummy bit line DBL and the combined structure of the top electrode TE of the magnetic tunnel junction structure MTJ may overlap the device isolation layer 103 and the second dopant regions DR2, respectively.

FIGS. 3A to 5A are cross-sectional views taken along line I-I' of FIG. 1 to illustrate a method of manufacturing a magnetic memory device according to an exemplary embodiment of the present inventive concept. FIGS. 3B to 5B are cross-sectional views taken along line II-II' of FIG. 1 to illustrate a method of manufacturing a magnetic memory device according to an exemplary embodiment of the present inventive concept.

Figure 3A:
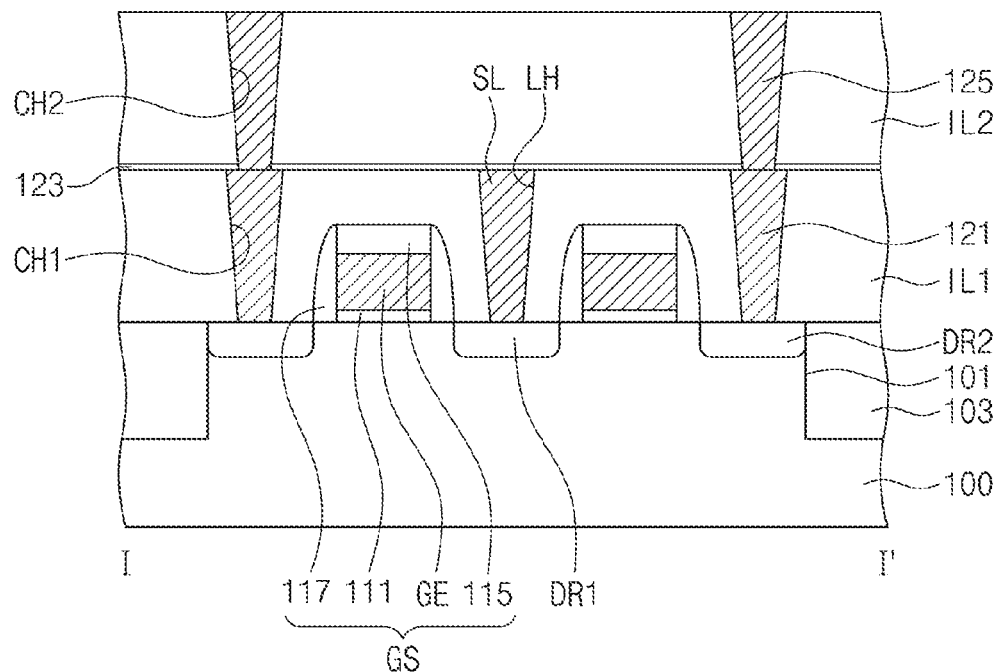
Figure 3B:
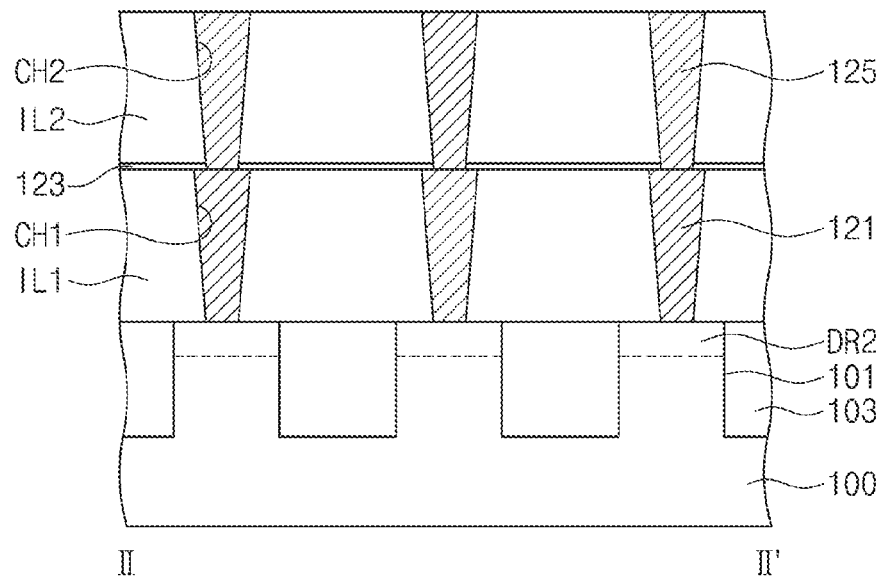

Referring to FIGS. 3A and 3B, a substrate 100 may be provided. The substrate 100 may be a silicon substrate, a germanium substrate, or a silicon-germanium substrate. The substrate 100 may have a first conductivity type. A device isolation layer 103 may be formed in the substrate 100. The substrate 100 may be etched by a patterning process to form a device isolation trench 101, and the device isolation layer 103 may be formed in the device isolation trench 101 by filling the device isolation trench 101 with an insulating material. The device isolation layer 103 may include the insulating material such as a silicon oxide layer, a silicon nitride layer, and a silicon oxynitride layer. The device isolation layer 103 may define active regions AR of the substrate 100. For example, the device isolation layer 103 may surround each of the active regions AR so that the active regions AR are electrically isolated from each other. Each of the active regions AR may have a bar-type island shape extending in a first direction X when viewed in plan.

Gate structures GS may be formed on the active regions AR. For example, a pair of the gate structures GS may be formed on one active region AR. The gate structures GS may extend in a second direction Y intersecting the first direction X to intersect the active regions AR. Each of the gate structures GS may include a gate insulating layer 111, a gate electrode GE, a gate capping layer 115, and spacers 117. The gate insulating layer 111, the gate electrode GE, and the gate capping layer 115 may be sequentially formed as listed on the active regions AR. The spacers 117 may be formed to cover sidewalls of the gate insulating layer 111, sidewalls of the gate electrode GE, and sidewalls of the gate capping layer 115.

For example, the gate insulating layer 111 may include a silicon oxide layer, a thermal oxide layer, or a high-k dielectric layer (e.g., a hafnium oxide layer or an aluminum oxide layer). For example, the gate electrode GE may include at least one conductive material such as poly-silicon doped with dopants, a metal, a metal alloy, and a metal silicide. The gate capping layer 115 may include an insulating material (e.g., a silicon oxide layer or a silicon nitride layer). The spacers 117 may include an insulating material (e.g., a silicon oxide layer or a silicon nitride layer).

First dopant regions DR1 and second dopant regions DR2 may be formed in the active regions AR at both sides of each of the gate structures GS. The first and second dopant regions DR1 and DR2 may be formed by injecting dopants of a second conductivity type different from the first conductivity type into the active regions AR. The first dopant region DR1 may be formed in a portion of the active region AR between the pair of gate structures GS disposed on the active region AR. For example, the first dopant region DR1 may be formed in a central portion of the active region AR. The second dopant regions DR2 may be formed in portions of the active region AR, which are disposed between the device isolation layer 103 and the pair of gate structures GS. For example, the second dopant regions DR2 may be formed in both end portions of the active region AR.

A first interlayer insulating layer IL1 may be formed on the substrate 100. The first interlayer insulating layer IL1 may cover top surfaces and sidewalls of the gate structures GS. For example, the first interlayer insulating layer IL1 may include a silicon oxide layer.

A source line SL and first contact plugs 121 may be formed in the first interlayer insulating layer IL1. A linear hole LH may be formed in the first interlayer insulating layer IL1 to expose the first dopant regions DR1 formed in the active regions AR arranged in the second direction Y. The source line SL may be formed in the linear hole LH by filling the linear hole LH with a conductive material. First contact holes CH1 may be formed in the first interlayer insulating layer IL1 to expose the second dopant regions DR2, respectively, and the first contact plugs 121 may be formed in the first contact holes CH1 by filling the first contact holes CH1 with a conductive material. In an exemplary embodiment, the source line SL and the first contact plugs 121 may be formed at substantially the same time. In this case, the source line SL and the first contact plugs 121 may be formed of substantially the same material. The present inventive concept is not limited thereto. For example, the source line SL may be formed by an additional process different from a process of forming the first contact plugs 121. In this case, the source line SL and the first contact plug 121 may be formed of substantially the same material or different materials. For example, the source line SL and the first contact plugs 121 may include a doped semiconductor material (e.g., doped silicon), a metal (e.g., tungsten, aluminum, titanium, or tantalum), a conductive metal nitride (e.g., titanium nitride, tantalum nitride, or tungsten nitride), or a metal-semiconductor compound (e.g., a metal silicide).

A capping insulating layer 123 and a second interlayer insulating layer IL2 may be sequentially formed as listed on the first interlayer insulating layer IL1. The capping insulating layer 123 may cover a top surface of the source line SL and top surfaces of the first contact plugs 121. The capping insulating layer 123 may be formed of an insulating material having etch selectivity with respect to the first interlayer insulating layer IL1. For example, the capping insulating layer 123 may include a silicon nitride layer or a silicon oxynitride layer. The second interlayer insulating layer IL2 may cover a top surface of the capping insulating layer 123. For example, the second interlayer insulating layer IL2 may include a silicon oxide layer.

Second contact plugs 125 may be formed in the capping insulating layer 123 and the second interlayer insulating layer IL2. Second contact holes CH2 exposing the top surfaces of the first contact plugs 121 may be formed in the second interlayer insulating layer IL2 and the capping insulating layer 123, and the second contact plugs 125 may be formed in the second contact holes CH2 by filling the second contact holes CH2 with a conductive material. For example, the second contact plugs 125 may include a doped semiconductor material (e.g., doped silicon), a metal (e.g., tungsten, aluminum, titanium, or tantalum), a conductive metal nitride (e.g., titanium nitride, tantalum nitride, or tungsten nitride), or a metal-semiconductor compound (e.g., a metal silicide).

Figure 4A:
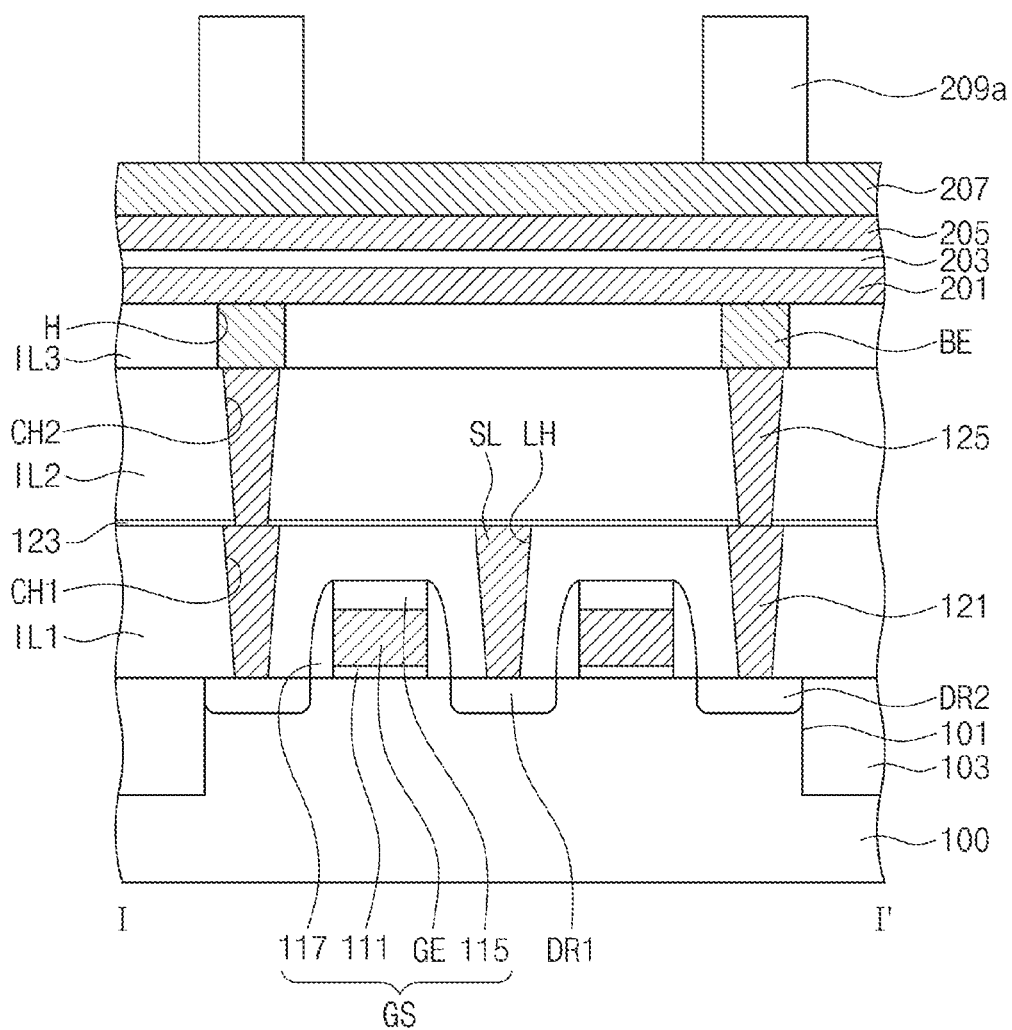
Figure 4B:
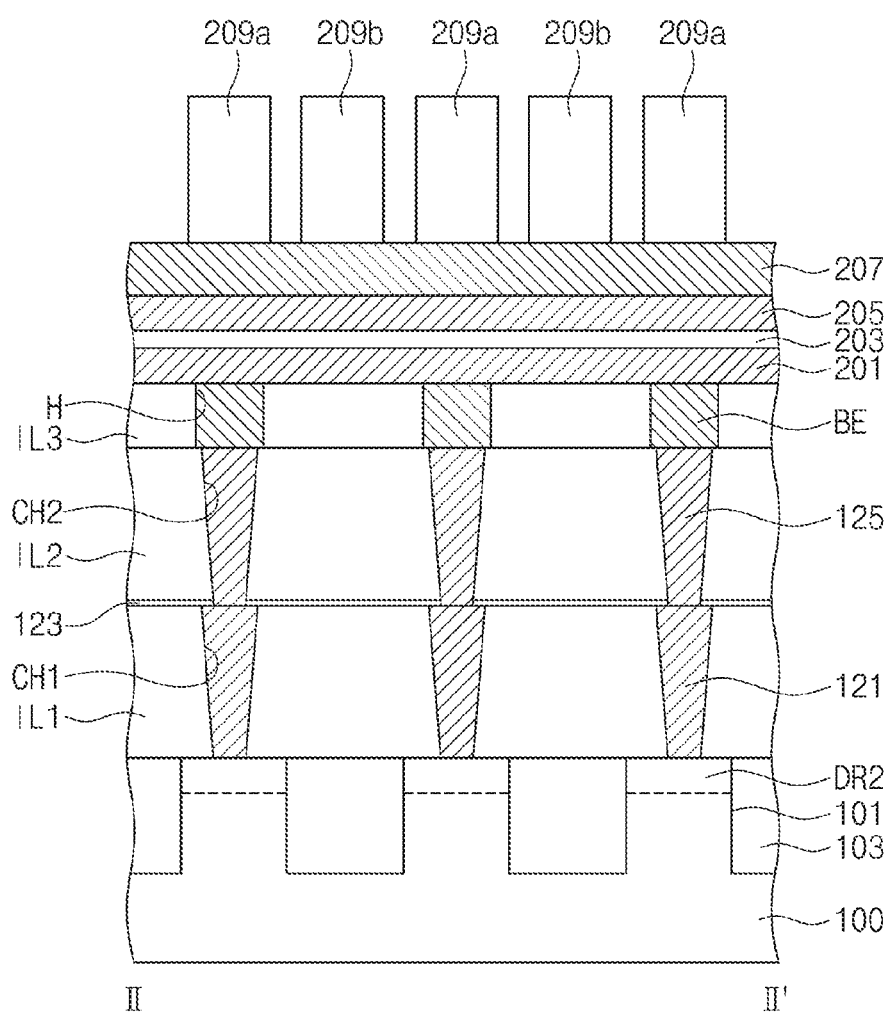

Referring to FIGS. 4A and 4B, a third interlayer insulating layer IL3 may be formed on the second interlayer insulating layer IL2. For example, the third interlayer insulating layer IL3 may include a silicon oxide layer. Bottom electrodes BE may be formed in the third interlayer insulating layer IL3. Holes H exposing the second contact plugs 125 may be formed in the third interlayer insulating layer IL3, and the bottom electrodes BE may be formed in the holes H by filling the holes H with a conductive material. For example, the bottom electrodes BE may include a conductive metal nitride (e.g., titanium nitride or tantalum nitride), a metal (e.g., titanium, tantalum, or tungsten), or a rare-earth metal (e.g., ruthenium or platinum).

A first magnetic conductive layer 201, a tunnel barrier layer 203, and a second magnetic conductive layer 205 may be sequentially formed as listed on the third interlayer insulating layer IL3. One of the first magnetic conductive layers 201 and the second magnetic conductive layers 205 may have a magnetization direction fixed in one direction, and the other of the first magnetic conductive layer 201 and the second magnetic conductive layers 205 may have a changeable magnetization direction. The magnetization directions of the first magnetic conductive layers 201 and the second magnetic conductive layers 205 may be substantially parallel to a top surface of the substrate 100. The present inventive concept is not limited thereto. For example, the magnetization directions of the first magnetic conductive layers 201 and the second magnetic conductive layers 205 may be substantially perpendicular to the top surface of the substrate 100. In this case, the first magnetic conductive layers 201 and the second magnetic conductive layers 205 may include a material having interface perpendicular magnetic anisotropy. The first magnetic conductive layer 201 may be formed of the same material as the first magnetic conductive pattern MS1 as described above, and the second magnetic conductive layer 205 may be formed of the same material as the second magnetic conductive pattern MS2 as described above. Thus, detailed descriptions of the materials forming the first magnetic conductive layers 201 and the second magnetic conductive layers 205 will be omitted for ease and convenience in explanation.

For example, the tunnel barrier layer 203 may include magnesium oxide, titanium oxide, aluminum oxide, magnesium-zinc oxide, or magnesium-boron oxide. The first magnetic conductive layers 201, the second magnetic conductive layers 205 and the tunnel barrier layer 203 may be formed by a chemical vapor deposition (CVD) process, a physical vapor deposition (PVD) process, or an atomic layer deposition (ALD) process.

A top electrode layer 207 may be formed on the second magnetic conductive layer 205. For example, the top electrode layer 207 may include a conductive metal nitride (e.g., titanium nitride or tantalum nitride), a metal (e.g., tungsten, titanium, or tantalum), or a rare-earth metal (e.g., ruthenium or platinum). The top electrode layer 207 may be formed by a CVD process, a PVD process, or an ALD process.

First mask patterns 209a and second mask patterns 209b may be formed on the top electrode layer 207. The first mask patterns 209a may vertically overlap the bottom electrodes BE, respectively. The first mask patterns 209a may define positions at which magnetic tunnel junction structures MTJ will be formed. Each of the second mask patterns 209b may be disposed between the first mask patterns 209a adjacent to each other in the second direction Y and may extend in the first direction X. The second mask patterns 209b may define positions at which bit lines BL will be formed. The first mask patterns 209a and the second mask patterns 209b may include, for example, a metal material or an insulating material.

Figure 5A:
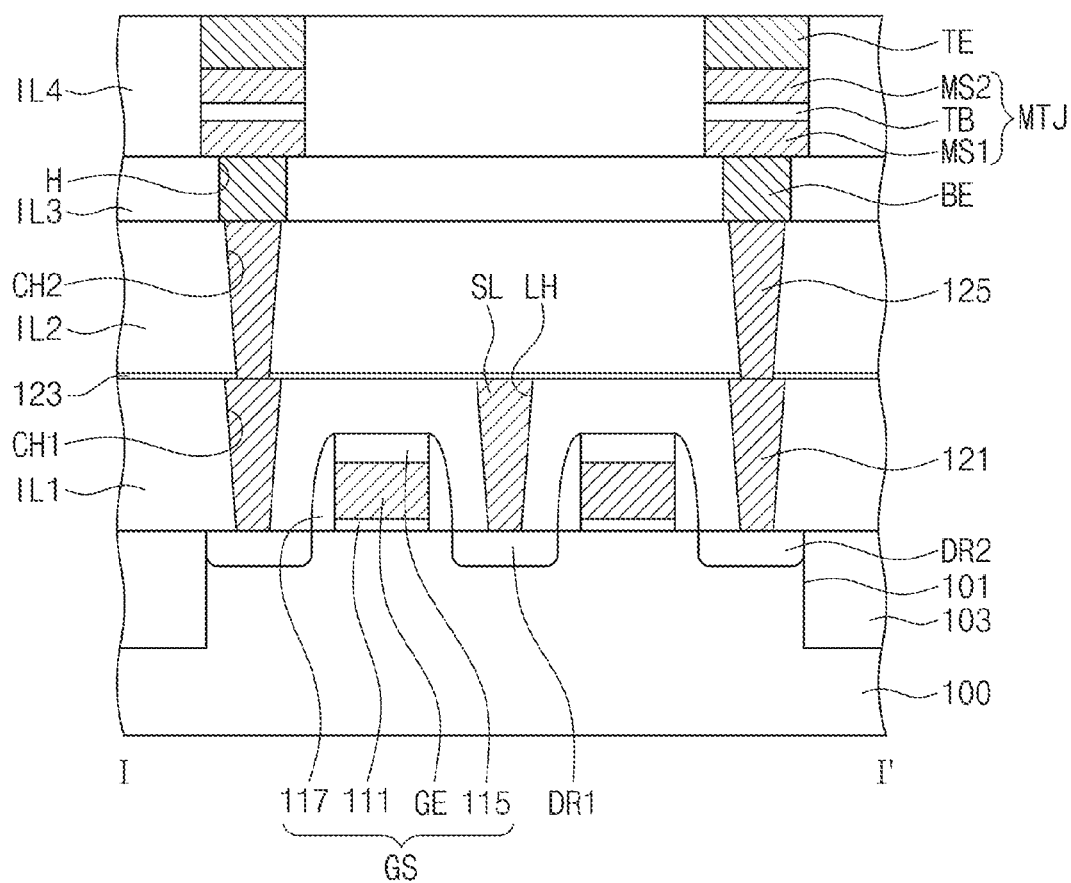
Figure 5B:
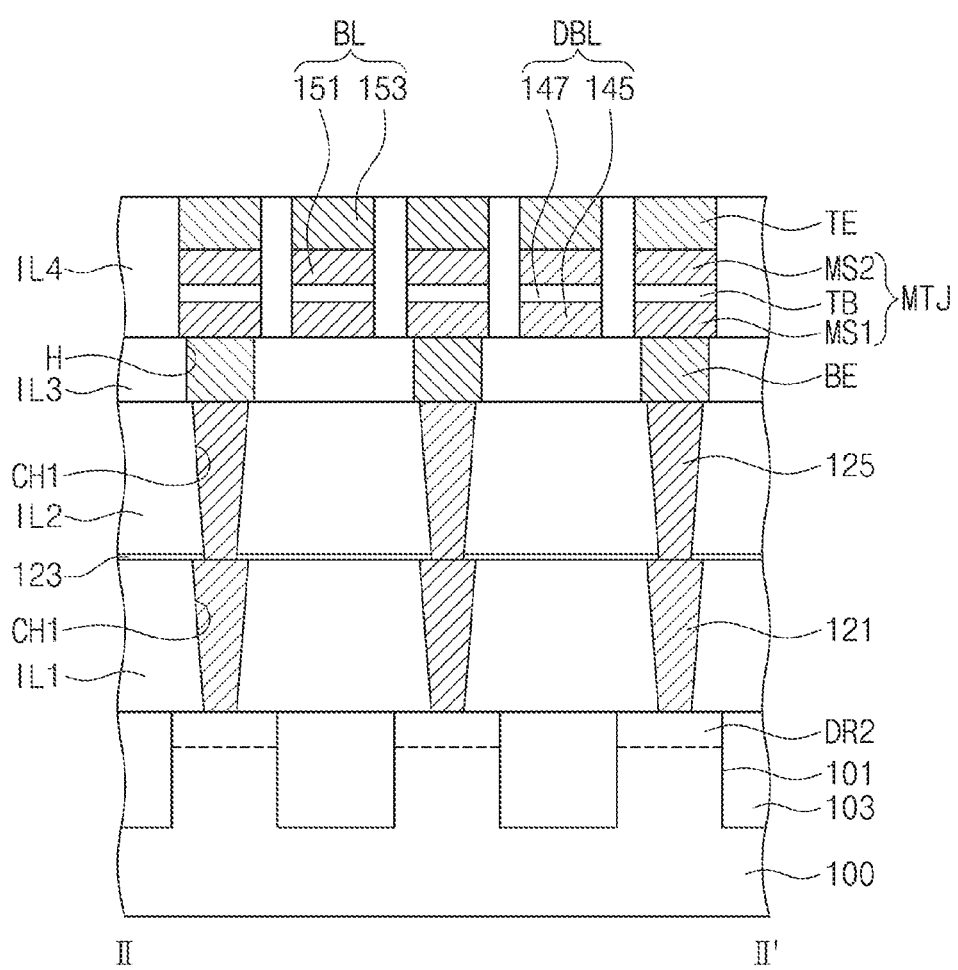

Referring to FIGS. 5A and 5B, the top electrode layer 207, the second magnetic conductive layer 205, the tunnel barrier layer 203, and the first magnetic conductive layer 201 may be patterned using the first mask patterns 209a and the second mask patterns 209b as etch masks to form top electrodes TE, magnetic tunnel junction structures MTJ, bit lines BL, and dummy bit lines DBL. The patterning process may be performed using an ion beam etching process. The patterning process may be performed until a top surface of the third interlayer insulating layer IL3 and top surfaces of the bottom electrodes BE are exposed.

Each of the magnetic tunnel junction structures MTJ may include a first magnetic conductive pattern MS1, a tunnel barrier pattern TB, and a second magnetic conductive pattern MS2, which are sequentially stacked as listed on each of the bottom electrodes BE. The first magnetic conductive pattern MS1 may be formed by patterning the first magnetic conductive layer 201, the tunnel barrier pattern TB may be formed by patterning the tunnel barrier layer 203, and the second magnetic conductive pattern MS2 may be formed by patterning the second magnetic conductive layer 205. The magnetic tunnel junction structures MTJ may vertically overlap the bottom electrodes BE, respectively. The magnetic tunnel junction structures MTJ may be spaced apart from each other in the first direction X and the second direction Y. Each of the top electrodes TE may be formed on one of the second magnetic conductive patterns MS2. The top electrodes TE may be spaced apart from each other in the first direction X and the second direction Y.

The dummy bit line DBL and the bit line BL may be sequentially formed as listed on the top surface of the third interlayer insulating layer IL3. Each of the dummy bit lines DBL may include a dummy magnetic pattern 145 and a dummy barrier pattern 147, which are sequentially formed as listed on the top surface of the third interlayer insulating layer IL3. The dummy magnetic pattern 145 may be formed by patterning the first magnetic conductive layer 201, and thus a top surface of the dummy magnetic pattern 145 may be disposed at substantially the same level as a top surface of the first magnetic conductive pattern MS1. In addition, a thickness of the dummy magnetic pattern 145 may be substantially equal to a thickness of the first magnetic conductive pattern MS1. The dummy magnetic pattern 145 and the first magnetic conductive pattern MS1 may include the same material. In an exemplary embodiment, if the first magnetic conductive layer 201 includes a plurality of layers, the number and a structure of layers included in the dummy magnetic pattern 145 may be substantially the same as the number and a structure of layers included in the first magnetic conductive pattern MS1.

The dummy barrier pattern 147 may be formed by patterning the tunnel barrier layer 203, and thus a top surface of the dummy barrier pattern 147 may be disposed at substantially the same level as a top surface of the tunnel barrier pattern TB. In addition, a thickness of the dummy barrier pattern 147 may be substantially equal to a thickness of the tunnel barrier pattern TB. The dummy barrier pattern 147 and the tunnel barrier pattern TB may include the same material.

Each of the bit lines BL may include a conductive pattern 153 and a magnetic pattern 151. The magnetic pattern 151 may be disposed between the conductive pattern 153 and the dummy barrier pattern 147. The magnetic pattern 151 may be formed by patterning the second magnetic conductive layer 205, and thus a top surface of the magnetic pattern 151 may be disposed at substantially the same level as a top surface of the second magnetic conductive pattern MS2. In addition, a thickness of the magnetic pattern 151 may be substantially equal to a thickness of the second magnetic conductive pattern MS2. The magnetic pattern 151 and the second magnetic conductive pattern MS2 may include substantially the same material. In an exemplary embodiment, if the second magnetic conductive layer 205 includes a plurality of layers, the number and a structure of layers included in the magnetic pattern 151 may be substantially the same as the number and a structure of layers included in the second magnetic conductive pattern MS2.

The conductive pattern 153 may be formed by patterning the top electrode layer 207, and thus a top surface of the conductive pattern 153 may be disposed at substantially the same level as top surfaces of the top electrodes TE. In addition, a thickness of the conductive pattern 153 may be substantially equal to thicknesses of the top electrodes TE. The conductive pattern 153 and the top electrodes TE may include substantially the same material.

In an exemplary embodiment, the bit line BL may have both the same layer structure as a portion of the magnetic tunnel junction structure MTJ and the same layer structure as the top electrode TE. For example, the bit line BL including a conductive material may have both the same layer structure as the second magnetic conductive pattern MS2 of the magnetic tunnel junction structure MTJ and the same layer structure as the top electrode TE. In addition, the bit line BL may include both the same material as the second magnetic conductive pattern MS2 and the same material as the top electrode TE.

The first mask patterns 209a and the second mask patterns 209b may be removed after the formation of the magnetic tunnel junction structures MTJ, the top electrodes TE, the bit lines BL, and the dummy bit lines DBL. Thus, top surfaces of the top electrodes TE and top surfaces of the bit lines BL may be exposed.

A fourth interlayer insulating layer IL4 may be formed on the third interlayer insulating layer IL3. An insulating layer may be formed to fill spaces between the bit lines BL, spaces between the dummy bit lines DBL, and spaces between the bit lines BL and the magnetic tunnel junction structures MTJ and to cover the top surfaces of the bit lines BL and the top surfaces of the top electrodes TE. A planarization process, then, may be performed on the insulating layer until the top surfaces of the top electrodes and the bit lines BL are exposed to form the fourth interlayer insulating layer IL4. For example, the fourth interlayer insulating layer IL4 may include a silicon oxide layer.

According to an exemplary embodiment of the present inventive concept, a combined structure of the bit lines BL and the dummy bit lines DBL and a combined structure of the magnetic tunnel junction structures MTJ and the top electrodes TE may be formed at substantially the same time. A thickness of the combined structure of the bit lines BL and the dummy bit lines DBL and a thickness of the combined structure of the magnetic tunnel junction structures MTJ and the top electrodes TE may be substantially the same. Each of the bit lines BL may be formed between two magnetic tunnel junction structures MTJ adjacent to each other in the second direction Y and between two top electrodes TE adjacent to each other in the second direction Y. Thus, various problems may be solved. For example, if the top electrode layer 207, which will become a mask for a patterning process in an ion beam etching process, is thick, it may be difficult to perform a dry etching process on the top electrode layer 207, the second magnetic conductive layer 205, the tunnel barrier layer 203 and the first magnetic conductive layer 201 in the patterning process. If the top electrode layer 207 is thin, the top electrodes TE may be etched in an etching process for forming holes, in which bit lines are provided, on the top electrodes TE, thereby damaging the magnetic tunnel junction structures MTJ.

Referring back to FIGS. 2A and 2B, connection patterns 155 may be formed on the top electrodes TE. The connection patterns 155 may electrically connect the top electrodes TE to the bit lines BL. For example, the connection patterns 155 formed on the top electrodes TE arranged in the first direction X may be in contact with a corresponding one of the bit lines BL to electrically connect the top electrodes TE to the corresponding bit line BL. The connection patterns 155 may include a metal material (e.g., tungsten or copper). For example, the connection pattern 155 may connect electrically one of the bit lines BL to one of the top electrodes TE adjacent to the one of the bit lines BL in the second direction Y. In this case, the connection pattern 115 may extend in the second direction Y.

According to an exemplary embodiment of the present inventive concept, the bit lines may be formed simultaneously with the magnetic tunnel junction structures and the top electrodes. Each of the bit lines may be formed between two magnetic tunnel junction structures adjacent to each other and between two top electrodes adjacent to each other. For example, a combined structure of a bit line and a dummy bit line and a combined structure of a top electrode and a magnetic tunnel junction structure may be formed at substantially the same time. Thus, the thickness of the top electrode layer may be such that the top electrode need not prevent the patterning of the top electrode layer, the second magnetic conductive layer, the tunnel barrier layer, and the first magnetic conductive layer in the ion beam etching process. In addition, the magnetic tunnel junction structures need not be damaged when the bit lines are formed.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A magnetic memory device, comprising:
a plurality of magnetic tunnel junction structures arranged in rows and columns on a substrate;
a plurality of top electrodes disposed on the plurality of magnetic tunnel junction structures, each respective top electrode being disposed on a corresponding magnetic tunnel junction structure and each respective top electrode including a top surface that is substantially at a same level as the top surface of other top electrodes; and
a plurality of bit lines disposed on the substrate, each bit line being separate from each top electrode and including a top surface,
wherein at least one bit line is disposed between two corresponding magnetic tunnel junction structures that are adjacent to each other, and
wherein the top surface of the at least one bit line is disposed at substantially a same level as the top surface of each of the plurality of top electrodes;
a dummy bit line disposed between the substrate and the one of the plurality of bit lines,
wherein the dummy bit line comprises:
a dummy magnetic pattern; and
a dummy barrier pattern disposed between the dummy magnetic pattern and the one of the plurality of bit lines;
wherein each of the plurality of magnetic tunnel junction structures comprises:
a first magnetic conductive pattern;
a tunnel barrier pattern; and
a second magnetic conductive pattern, wherein the dummy magnetic pattern is formed from a first material and the dummy barrier pattern is formed from a second material, wherein the first magnetic conductive pattern, the tunnel barrier pattern and the second magnetic conductive pattern are stacked as listed on the substrate, wherein the first magnetic conductive pattern includes substantially a same material as the dummy magnetic pattern, and wherein the tunnel barrier pattern includes substantially a same material as the dummy barrier pattern.

2. The magnetic memory device of claim 1, wherein each of the plurality of magnetic tunnel junction structures comprises:

a first magnetic conductive pattern; and a second magnetic conductive pattern formed from a first material, wherein the second magnetic conductive pattern is stacked on the first magnetic conductive pattern so that the first magnetic conductive pattern is disposed between the substrate and the second magnetic conductive pattern, wherein the plurality of top electrodes are formed from a second material and wherein each of the plurality of bit lines includes substantially a same material as at least one of the second magnetic conductive pattern and one of the plurality of top electrodes.

3. The magnetic memory device of claim 1, wherein each of the plurality of bit lines comprises:

a magnetic pattern that is separate from each magnetic tunnel junction structure; and a conductive pattern that is separate from each top electrode, and wherein the conductive pattern is stacked on the magnetic pattern so that the magnetic pattern is disposed between the substrate and the conductive pattern.

4. The magnetic memory device of claim 1, further comprising:

a dummy bit line disposed between the substrate and the one of the plurality of bit lines, wherein the dummy bit line is electrically insulated from the one of the plurality of bit lines.

5. The magnetic memory device of claim 1, wherein each bit line of the plurality of bit lines extends in a first direction, and wherein the two magnetic tunnel junction structures that are adjacent to each other and corresponding to the at least one bit line are spaced apart from each other in a second direction intersecting the first direction.

6. The magnetic memory device of claim 5, further comprising:

a connection pattern electrically connecting the at least one bit line to one of the plurality of top electrodes adjacent to the at least one bit line, wherein the connection pattern extends in the second direction.

7. The magnetic memory device of claim 1, further comprising:

a connection pattern electrically connecting the at least one bit line to one of the plurality of top electrodes adjacent to the at least one bit line.

8. The magnetic memory device of claim 7, wherein the connection pattern is in contact with the top surface of the one of the plurality of top electrodes and the top surface of the at least one bit line.

9. The magnetic memory device of claim 1, further comprising:

a device isolation layer disposed in the substrate to define a plurality of active regions, wherein the at least one bit line overlaps the device isolation layer disposed between the two magnetic tunnel junction structures that are adjacent to each other and corresponding to the at least one bit line.

10. The magnetic memory device of claim 9, wherein at least one of the plurality of magnetic tunnel junction structures vertically overlaps one of the plurality of active regions.

11. A magnetic memory device, comprising:

a plurality of magnetic tunnel junction structures arranged in a first direction and a second direction intersecting the first direction, each of the plurality of magnetic tunnel junction structures comprising a first magnetic conductive pattern, a tunnel barrier pattern, and a second magnetic conductive pattern that are stacked as listed on a substrate, the second magnetic conductive pattern being formed from a first material; and a plurality of bit lines disposed on the substrate, each bit line being separate from a magnetic tunnel junction, wherein at least one bit line is disposed between two magnetic tunnel junction structures that are adjacent to each other in the second direction, wherein the plurality of bit lines each extends in the first direction, and wherein the at least one bit line includes a same material as the second magnetic conductive pattern;

a dummy bit line disposed between the substrate and the one of the plurality of bit lines, wherein the dummy bit line comprises:

a dummy magnetic pattern; and a dummy barrier pattern disposed between the dummy magnetic pattern and the one of the plurality of bit lines;

wherein each of the plurality of magnetic tunnel junction structures comprises:

a first magnetic conductive pattern;

a tunnel barrier pattern; and a second magnetic conductive pattern, wherein the dummy magnetic pattern is formed from a first material and the dummy barrier pattern is formed from a second material, wherein the first magnetic conductive pattern, the tunnel barrier pattern and the second magnetic conductive pattern are stacked as listed on the substrate, wherein the first magnetic conductive pattern includes substantially a same material as the dummy magnetic pattern, and wherein the tunnel barrier pattern includes substantially a same material as the dummy barrier pattern.

12. The magnetic memory device of claim 11, wherein the plurality of bit lines each comprises a magnetic pattern and a conductive pattern that are stacked as listed on the substrate, wherein the magnetic pattern includes substantially a same material as the second magnetic conductive pattern, and wherein the conductive pattern includes a metal material.

13. The magnetic memory device of claim 11, wherein the at least one bit line comprises a magnetic pattern and a conductive pattern that are stacked as listed on the substrate, and wherein a top surface of the magnetic pattern of the at least one bit line is disposed at substantially a same level as a top surface of the second magnetic conductive pattern.

14. The magnetic memory device of claim 11,
wherein the dummy bit line extends in the first direction, and
wherein the one of the plurality of bit lines is electrically insulated from the dummy bit line.

15. The magnetic memory device of claim 11,
wherein the plurality of magnetic tunnel junction structures is arranged in rows and columns, and
wherein each of the rows of the plurality of magnetic tunnel junction structures and each of the plurality of bit lines are alternately arranged in the second direction.

16. A magnetic memory device, comprising:
a bit line disposed on a substrate, the bit line extending in a first direction;
a dummy bit line disposed between the bit line and the substrate;
a first magnetic tunnel junction structure disposed on the substrate and adjacent to a first side of the bit line;
a second magnetic tunnel junction structure disposed on the substrate and adjacent to a second side of the bit line,
wherein the first magnetic tunnel junction structure and the second magnetic tunnel junction structure are arranged in a second direction intersecting the first direction; and
a top electrode disposed on the first magnetic tunnel junction structure, the top electrode being separate from the bit line,
wherein a thickness of a combined structure of the bit line and the dummy bit line is substantially a same as a thickness of a combined structure of the top electrode of the first magnetic tunnel junction structure;
wherein the dummy bit line comprises:
a dummy magnetic pattern; and
a dummy barrier pattern disposed between the dummy magnetic pattern and the bit line;
wherein the magnetic tunnel junction structures comprises:
a first magnetic conductive pattern;
a tunnel barrier pattern; and
a second magnetic conductive pattern,
wherein the dummy magnetic pattern is formed from a first material and the dummy barrier pattern is formed from a second material,
wherein the first magnetic conductive pattern, the tunnel barrier pattern and the second magnetic conductive pattern are stacked as listed on the substrate,
wherein the first magnetic conductive pattern includes substantially a same material as the dummy magnetic pattern, and
wherein the tunnel barrier pattern includes substantially a same material as the dummy barrier pattern.

17. The magnetic memory device of claim 16,
wherein a top surface of the combined structure of the bit line and the dummy bit line is substantially a same level as a top surface of the combined structure of the top electrode of the first magnetic tunnel junction structure.

18. The magnetic memory device of claim 16, further comprising:
a connection pattern electrically connecting the bit line to the top electrode,
wherein a top surface of the bit line and a top surface of the top electrode is substantially a same level, and
wherein the connection pattern is in contact with the top surface of the bit line and the top surface of the top electrode.

* * * * *